(12) United States Patent
Busch et al.

(10) Patent No.: US 7,202,127 B2
(45) Date of Patent: *Apr. 10, 2007

(54) METHODS OF FORMING A PLURALITY OF CAPACITORS

(75) Inventors: Brett W. Busch, Boise, ID (US); Fred D. Fishburn, Boise, ID (US); James Rominger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

This patent is subject to a terminal disclaimer.

(21) Appl. No.: 10/928,931

(22) Filed: Aug. 27, 2004

(65) Prior Publication Data

US 2006/0051918 A1  Mar. 9, 2006

(51) Int. Cl.
*H01L 21/8242* (2006.01)
(52) U.S. Cl. ............... 438/253; 438/396; 257/E27.094
(58) Field of Classification Search ........ 438/253–256, 438/396–399, 238, 381
See application file for complete search history.

(56) References Cited

U.S. PATENT DOCUMENTS

| | | | |
|---|---|---|---|
| 5,236,860 A | 8/1993 | Fazan et al. |
| 5,340,763 A | 8/1994 | Dennison |
| 5,401,681 A | 3/1995 | Dennison et al. |
| 5,498,562 A | 3/1996 | Dennison et al. |
| 5,604,696 A | 2/1997 | Takaishi |
| 5,605,857 A | 2/1997 | Jost et al. |
| 5,652,164 A | 7/1997 | Dennison et al. |
| 5,654,222 A | 8/1997 | Sandhu et al. |
| 5,686,747 A | 11/1997 | Jost et al. |
| 5,702,990 A | 12/1997 | Jost et al. |
| 5,705,838 A | 1/1998 | Jost et al. |
| 5,767,561 A | 6/1998 | Frei et al. |
| 5,821,140 A | 10/1998 | Jost et al. |
| 5,900,660 A | 5/1999 | Jost et al. |
| 5,955,758 A | 9/1999 | Sandhu et al. |

(Continued)

FOREIGN PATENT DOCUMENTS

DE  4447804  1/2002

(Continued)

OTHER PUBLICATIONS

Banhart, *Aluminum Foams: On the Road to Real Applications*, MRS Bulletin, pp. 290-295 (Apr. 2003).

(Continued)

*Primary Examiner*—H. Jey Tsai
(74) *Attorney, Agent, or Firm*—Wells St. John P.S.

(57) ABSTRACT

A plurality of capacitor electrode openings is formed within capacitor electrode-forming material. A first set of the openings is formed to a depth which is greater within the capacitor electrode-forming material than is a second set of the openings. Conductive first capacitor electrode material is formed therein. A sacrificial retaining structure is formed elevationally over both the first capacitor electrode material and the capacitor electrode-forming material, leaving some of the capacitor electrode-forming material exposed. With the retaining structure in place, at least some of the capacitor electrode-forming material is etched from the substrate effective to expose outer sidewall surfaces of the first capacitor electrode material. Then, the sacrificial retaining structure is removed from the substrate, and then capacitor dielectric material and conductive second capacitor electrode material are formed over the outer sidewall surfaces of the first capacitor electrode material formed within the first and second sets of capacitor openings.

28 Claims, 8 Drawing Sheets

U.S. PATENT DOCUMENTS

| | | | |
|---|---|---|---|
| 5,981,350 A | 11/1999 | Geusic et al. | |
| 5,990,021 A | 11/1999 | Prall et al. | |
| 6,037,218 A | 3/2000 | Dennison et al. | |
| 6,110,774 A | 8/2000 | Jost et al. | |
| 6,133,620 A | 10/2000 | Uochi | |
| 6,180,450 B1 | 1/2001 | Dennison | |
| 6,204,143 B1 | 3/2001 | Roberts et al. | |
| 6,204,178 B1 | 3/2001 | Marsh | |
| 6,303,956 B1 | 10/2001 | Sandhu et al. | |
| 6,403,442 B1 * | 6/2002 | Reinberg | 438/396 |
| 6,432,472 B1 | 8/2002 | Farrell et al. | |
| 6,617,222 B1 * | 9/2003 | Coursey | 438/398 |
| 6,667,502 B1 | 12/2003 | Agarwal et al. | |
| 6,673,693 B2 | 1/2004 | Kirchhoff | |
| 6,709,978 B2 | 3/2004 | Geusic et al. | |
| 6,812,513 B2 | 11/2004 | Geusic et al. | |
| 6,927,122 B2 | 8/2005 | Geusic et al. | |
| 7,042,040 B2 | 5/2006 | Horiguchi | |
| 7,073,969 B2 | 7/2006 | Kamm | |
| 7,074,669 B2 | 7/2006 | Iijima et al. | |
| 7,081,384 B2 | 7/2006 | Birner et al. | |
| 7,084,451 B2 | 8/2006 | Forbes et al. | |
| 2001/0012223 A1 | 8/2001 | Kohyama | |
| 2001/0026974 A1 | 10/2001 | Reinberg | |
| 2002/0030221 A1 | 3/2002 | Sandhu et al. | |
| 2002/0039826 A1 | 4/2002 | Reinberg | |
| 2002/0086479 A1 | 7/2002 | Reinberg | |
| 2002/0090779 A1 | 7/2002 | Jang | |
| 2002/0098654 A1 | 7/2002 | Durcan et al. | |
| 2002/0153614 A1 | 10/2002 | Ema et al. | |
| 2002/0163026 A1 | 11/2002 | Park | |
| 2003/0153146 A1 | 8/2003 | Won et al. | |
| 2003/0178684 A1 | 9/2003 | Nakamura | |
| 2003/0190782 A1 | 10/2003 | Ko et al. | |
| 2003/0227044 A1 | 12/2003 | Park | |
| 2004/0056295 A1 | 3/2004 | Agarwal et al. | |

FOREIGN PATENT DOCUMENTS

| | | |
|---|---|---|
| DE | 4447804 C2 | 1/2002 |
| WO | 2004/ 027898 | 8/2004 |
| WO | 2004/ 040252 | 12/2004 |
| WO | WO 2005/024936 | 3/2005 |

OTHER PUBLICATIONS

Gibson et al., *Cellular Solids*, MRS Bulletin, pp. 270-274 (Apr. 2003).

Green et al., *Cellular Ceramics: Intriguing Structures, Novel Properties, and Innovative Applications*, MRS Bulletin, pp. 296-300 (Apr. 2003).

Green et al., *The Structure and Applications of Cellular Ceramics*, Web Extra, 10 pages (Apr. 2003).

Karp et al., *Scaffolds for Tissue Engineering*, MRS Bulletin, pp. 301-306 (Apr. 2003).

Kraynik, *Foam Structure: From Soap Froth to Solid Foams*, MRS Bulletin, pp. 275-276 (Apr. 2003).

U.S. Appl. No. 11/006,331, filed Dec. 6, 2004, Cern Basceri et al.

Maire et al., *In Situ X-Ray Tomography Measurements of Deformation in Cellular Solids*, MRS Bulletin, pp. 284-289 (Apr. 2003).

Oh et al., *Preparation and Pore-Characteristics Control of Nano-Porous Materials Using Organometallic Building Blocks*, 4 Carbon Science, No. 1, pp. 1-9 (Mar. 2003).

Onck, *Scale Effects in Cellular Metals*, MRS Bulletin, pp. 279-283 (Apr. 2003).

Park et al., *Block Copolymer Lithography: Periodic Arrays of ~ $10^{11}$ Holes in 1 Square Centimeter*, 276 Science, pp. 1401-1404 (May 30, 1997).

Tsukada et al., *Preparation and Application of Porous Silk Fibroin Materials*, 54 Journal of Applied Polymer Science, pp. 507-514 (1994).

"Novel Robust Cell Capacitor (Leaning Exterminated Ring Type Insulator) And New Storage Node Contact (Top Spacer Contact) For 70nm DRAM Technology And Beyond"; Park et al.

J. P. O'Sullivan et al., *The morphology and mechanism of formation of porous anodic films on aluminium*, Proc. Roy. Soc. Lond.A, vol. 317, pp. 511-543 (1970).

S. Shingubara, *Fabrication of nanomaterials using porous alumina templates*, J. Nanoparticle Res., vol. 5, pp. 17-30 (2003).

S. Tan et al., *High Aspect Ratio Microstructures on Porous Anodic Aluminum Oxide*, IEEE, pp. 267-272 (1995).

J. Liang et al., *Nonlithographic Fabrication of Lateral Superlattices for Nanometric Electromagnetic-Optic . . .* IEEE J. Selected Topics in Quantum Electr., vol. 8, No. 5, pp. 998-1008 (Sep./Oct. 2002).

V. V. Konovalov et al., *Chemistry of Materials*, Chem. Mater., vol. 11, No. 8, pp. 1949-1951 (Aug. 1999).

H. Masuda et al., *Highly ordered nanochannel-array architecture in anodic alumina*, App. Phys. Lett, vol. 71, No. 19, pp. 2770-2772 (Nov. 1997).

D. Crouse et al., *Self-Assembled Nanostructures Using Anodized Alumina Thin Films for Optoelectronic Applications*, IEEE, pp. 234-235 (1999).

A. Nadeem et al., *Fabrication of Microstructures Using Aluminum Anodization Techniques*, pp. 274-277 (pre-2004).

C. Y. Liu et al., *Ordered anodic alumina nanochannels on focused-ion-beam-prepatterned aluminum surfaces*, Appl. Phys. Lett., vol. 78, No. 1, pp. 120-122 (Jan. 2001).

U.S. Appl. No. 10/929,037, filed Aug. 2004, Manning.

U.S. Appl. No. 10/656,732, filed Sep. 4, 2003, Manning.

U.S. Appl. No. 10/733,181, filed Dec. 10, 2003, Manning.

Kim, D.H. et al., "A Mechanically Enhanced Storage Node for Virtually Unlimited Height (MESH) Capacitor Aiming at Sub 70nm DRAMs", IEEE Jan. 2004, pp. 69-72.

U.S. Appl. No. 11/083,489, filed Mar. 2005, Sandhu et al.

U.S. Appl. No. 11/131,552, filed May 2005, Manning.

U.S. Appl. No. 11/131,575, filed May 2005, Manning et al.

U.S. Appl. No. 11/196,593, filed Aug. 2005, Sandhu et al.

Park et al., "Novel Robust Cell Capacitor (Leaning Exterminated Ring Type Insulator) And New Storage Node Contact (Top Spacer Contact) For 70nm DRAM Technology And Beyond"; 2004 Symposium on VLSI Technology Digest of Technical Papers; Jul. 2004; pp. 34-35.

U.S. Appl. No. 11/360,540, filed Feb. 2006, Rana.

U.S. Appl. No. 11/580,418, filed Oct. 2006, Raghu et al.

Li, X, and Bohn, P.w., "*Metal-assisted chemical etching in HF/$H_2O_2$ produces porous silicon*", Applied Physics Letters, vol. 77, No.16, Oct. 16, 2000, pp.2572-2574.

* cited by examiner

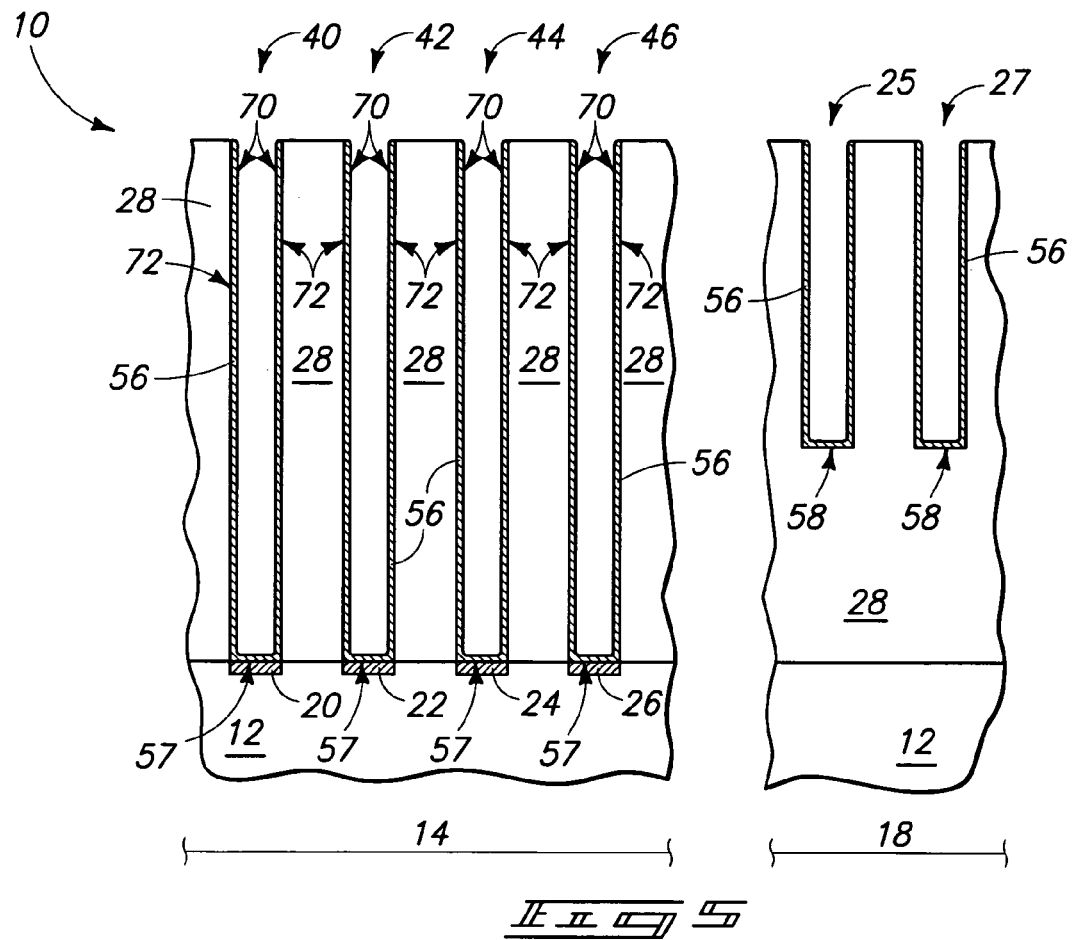
_F I G 5_
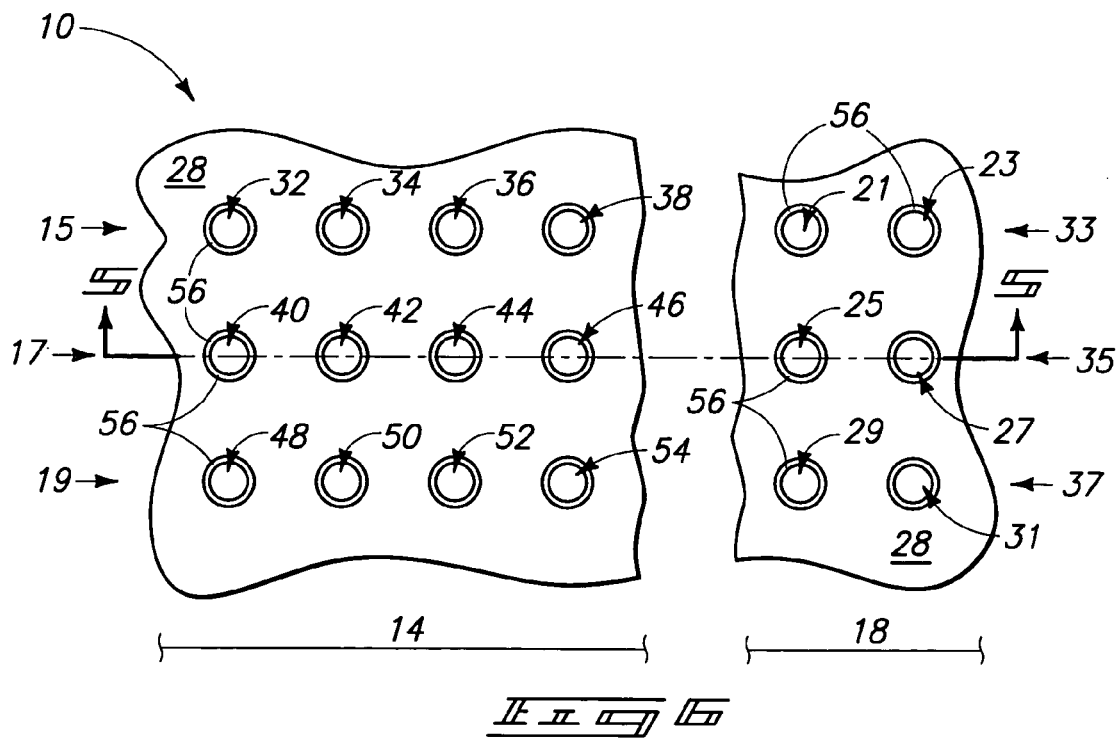
_F I G 6_

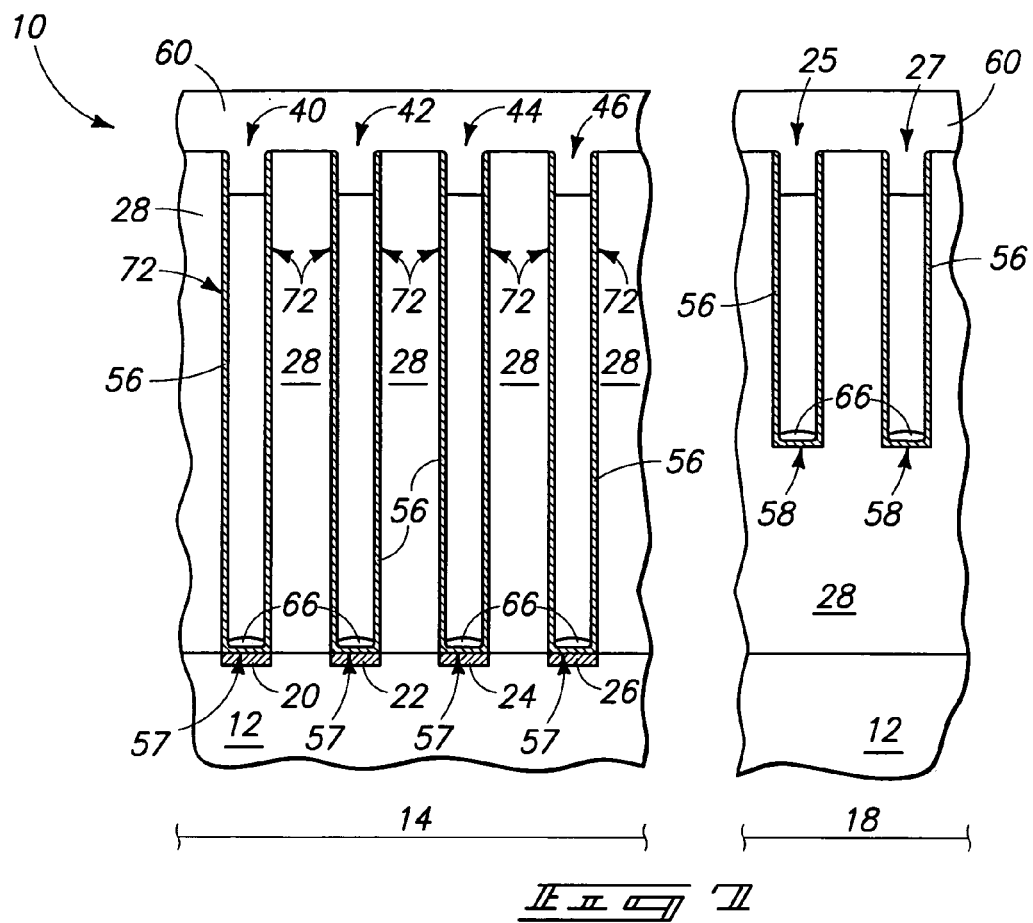
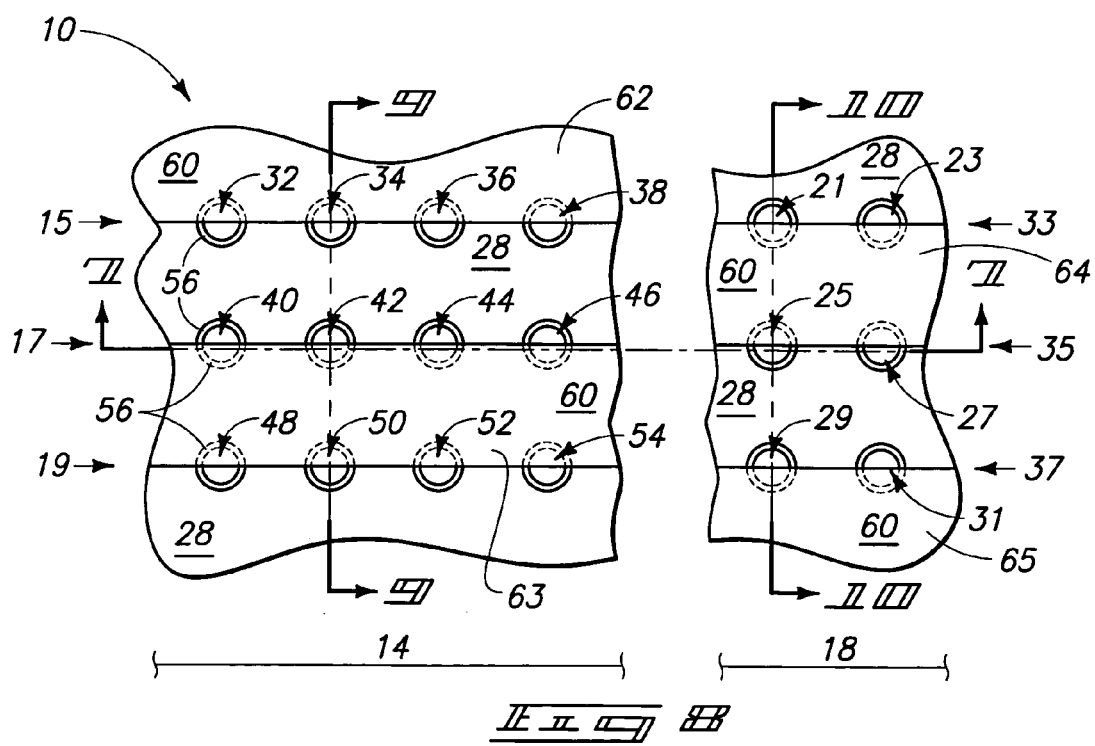

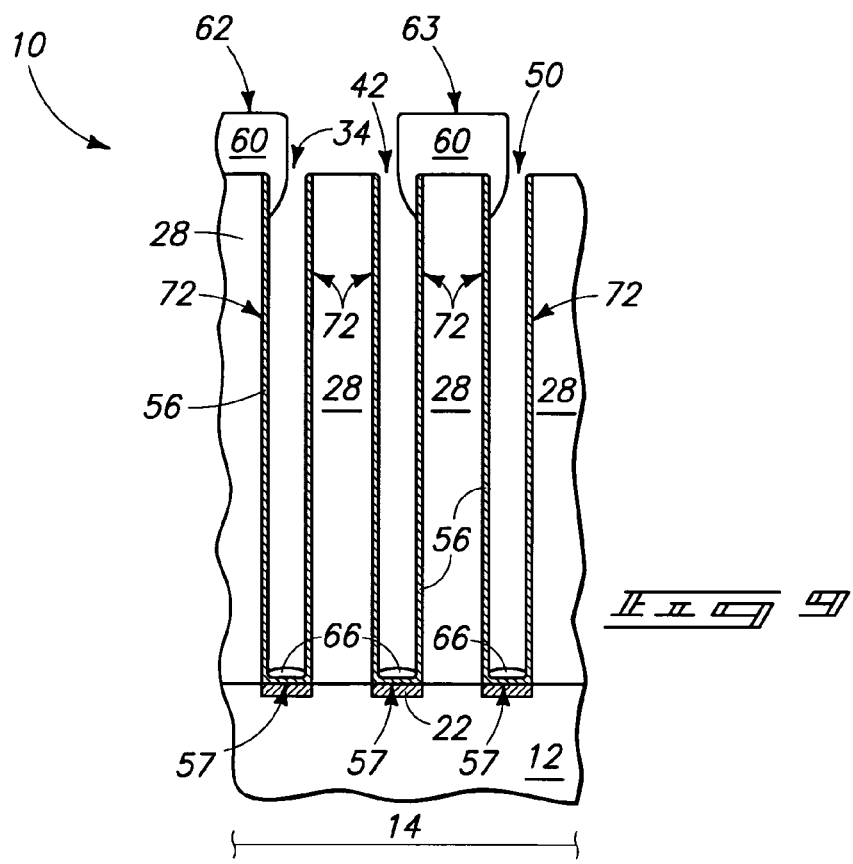
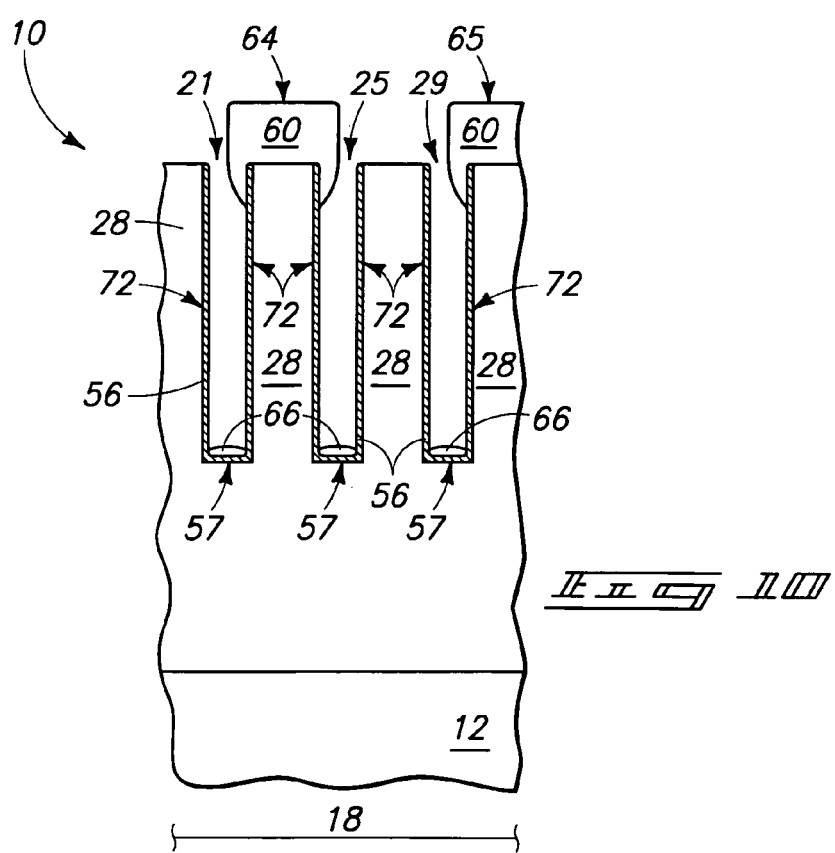

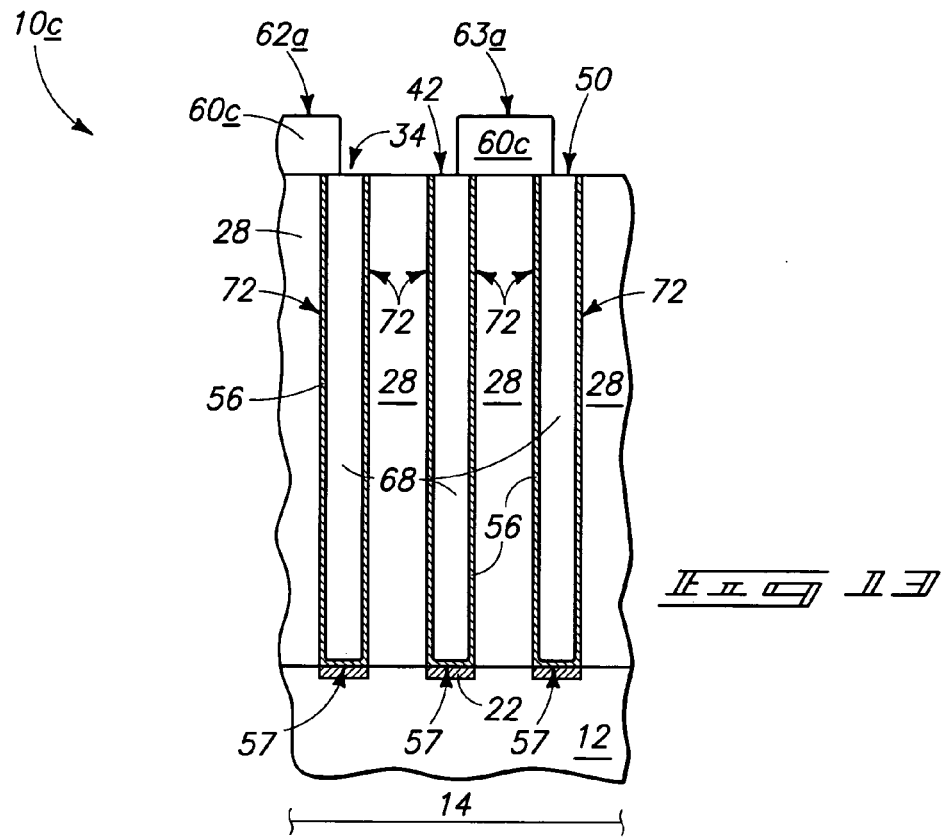
_FIG. 13_
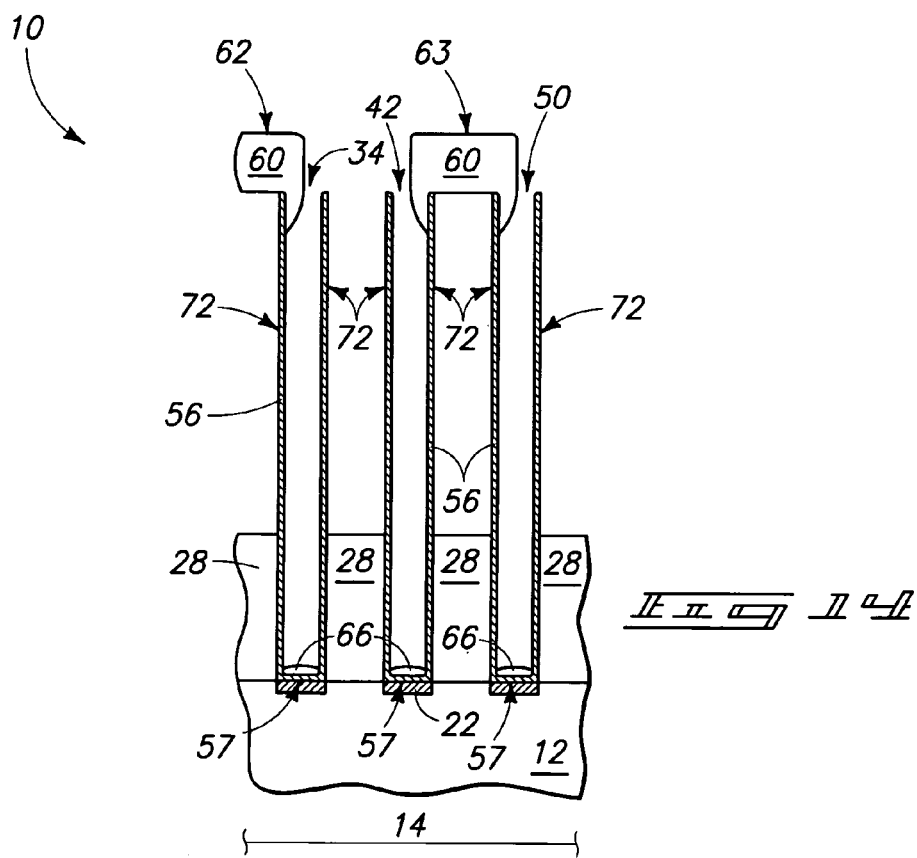
_FIG. 14_

METHODS OF FORMING A PLURALITY OF CAPACITORS

TECHNICAL FIELD

This invention relates to methods of forming a plurality of capacitors.

BACKGROUND OF THE INVENTION

Capacitors are one type of component which is commonly used in the fabrication of integrated circuit, for example in DRAM circuitry. A typical capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared to the vertical dimension. In some cases, the vertical dimension of capacitors has increased.

One manner of forming capacitors is to initially form an insulative material within which an initial of one of the capacitor electrodes is formed. For example, an array of capacitor electrode openings (also referred to as storage node openings) for individual capacitors is typically fabricated in such insulative capacitor electrode-forming material. One typical capacitor electrode-forming material is silicon dioxide doped with one or both the phosphorus and boron. One common capacitor electrode construction is a so-called container capacitor or device. Here, a container or cup-like shaped capacitor electrode is formed within the opening. A capacitor dielectric material and another capacitor electrode are formed thereover within the container. Where it is desired to utilize the outer lateral surfaces of the container or other electrode shape, the capacitor electrode-forming material is typically etched back after forming the initial electrode to expose outer lateral side surfaces thereof and prior to forming the capacitor dielectric material.

The etch which is used to form the capacitor electrode openings can unfortunately be non-uniform across a wafer being fabricated. For example, typically at the edge of the wafer, it is recognized that some of this area will not be usable for fabricating integrated circuitry. Further in this area, the etch which is conducted to form the container openings typically does not extend nearly as deep into the substrate as occurs in other areas where usable circuitry die are fabricated, for example in area displaced from the wafer edge. Such results in the capacitor electrode structures formed in this edge area as not being as deep into the capacitor electrode-forming material as elsewhere over the wafer. Unfortunately, the etch back of the capacitor electrode-forming material to expose the outer lateral sides of the capacitor electrodes is typically wet and can exceed the depth of the these peripherally formed electrodes. Thereby, such electrodes are no longer retained on the wafer in their original positions, and accordingly lift off the wafer and redeposit elsewhere, leading to fatal defects.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention comprises methods of forming a plurality of capacitors. In one implementation, a plurality of capacitor electrode openings are formed within capacitor electrode-forming material received over a substrate. A first set of the plurality of capacitor electrode openings is formed to a depth which is greater within the capacitor electrode-forming material than is a second set of the plurality of capacitor electrode openings. Conductive first capacitor electrode material is formed within the first and second sets of the plurality of capacitor electrode openings. The first capacitor electrode material comprises respective bases within the first and second sets of the plurality of capacitor electrode openings. A sacrificial retaining structure is formed elevationally over both the first capacitor electrode material and the capacitor electrode-forming material. The retaining structure leaves some of the capacitor electrode-forming material exposed. With the sacrificial retaining structure over the substrate, at least some of the capacitor electrode-forming material is etched from the substrate effective to expose outer sidewall surfaces of the first capacitor electrode material. After the etching, the sacrificial retaining structure is removed from the substrate, and then capacitor dielectric material and conductive second capacitor electrode material are formed over the outer sidewall surfaces of the first capacitor electrode material formed within the first and second sets of capacitor openings.

In one implementation, the capacitor electrode-forming material comprises silicon dioxide. After forming the first capacitor electrode material, a sacrificial retaining structure is formed elevationally over both the first capacitor electrode material and the capacitor electrode-forming material. The sacrificial retaining structure has a substantially planar base received on both silicon dioxide of the capacitor electrode-forming material and on the first capacitor electrode material.

In one implementation, the capacitor electrode-forming material is homogeneous. After forming such material, a sacrificial retaining structure is formed elevationally over both the first capacitor electrode material and the homogeneous capacitor electrode-forming material, with the sacrificial retaining structure being received on the homogeneous capacitor electrode-forming material.

In one implementation, the sacrificial retaining structure comprises at least one of polysilicon, amorphous carbon and silicon nitride, and has a substantially planar base received elevationally over the first capacitor electrode material and elevationally over the capacitor electrode-forming material.

Other aspects and implementations are contemplated.

BRIEF DESCRIPTION OF THE DRAWINGS

Preferred embodiments of the invention are described below with reference to the following accompanying drawings.

FIG. 5 is a view of the FIG. 3 substrate fragment at a processing step subsequent to that depicted by FIG. 3.

FIG. 6 is a view of the FIG. 4 substrate fragment at a processing step subsequent to that depicted by FIG. 4.

FIG. 7 is a view of the FIG. 5 substrate fragment at a processing step subsequent to that depicted by FIG. 5.

FIG. 8 is a view of the FIG. 6 substrate fragment at a processing step subsequent to that depicted by FIG. 6.

FIG. 9 sectional view taken through line 9—9 in FIG. 8.

FIG. 10 sectional view taken through line 10—10 in FIG. 8.

FIG. 13 is still another alternate embodiment to that depicted by FIG. 9.

FIG. 14 is a view of the FIG. 9 substrate fragment at a processing step subsequent to that depicted by FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Exemplary preferred embodiments of methods of forming a plurality of capacitors are described with reference to FIGS. 1–16. U.S. Patent Application Publication No. 2005/0054159 A1, entitled, "Semiconductor Constructions, and Methods of Forming Capacitor Devices", filed Dec. 10, 2003, naming H. Montgomery Manning, Thomas M. Graettinger, and Marsela Pontoh as inventors, is hereby fully incorporated by reference as if included in its entirety herein.

Figure 1:
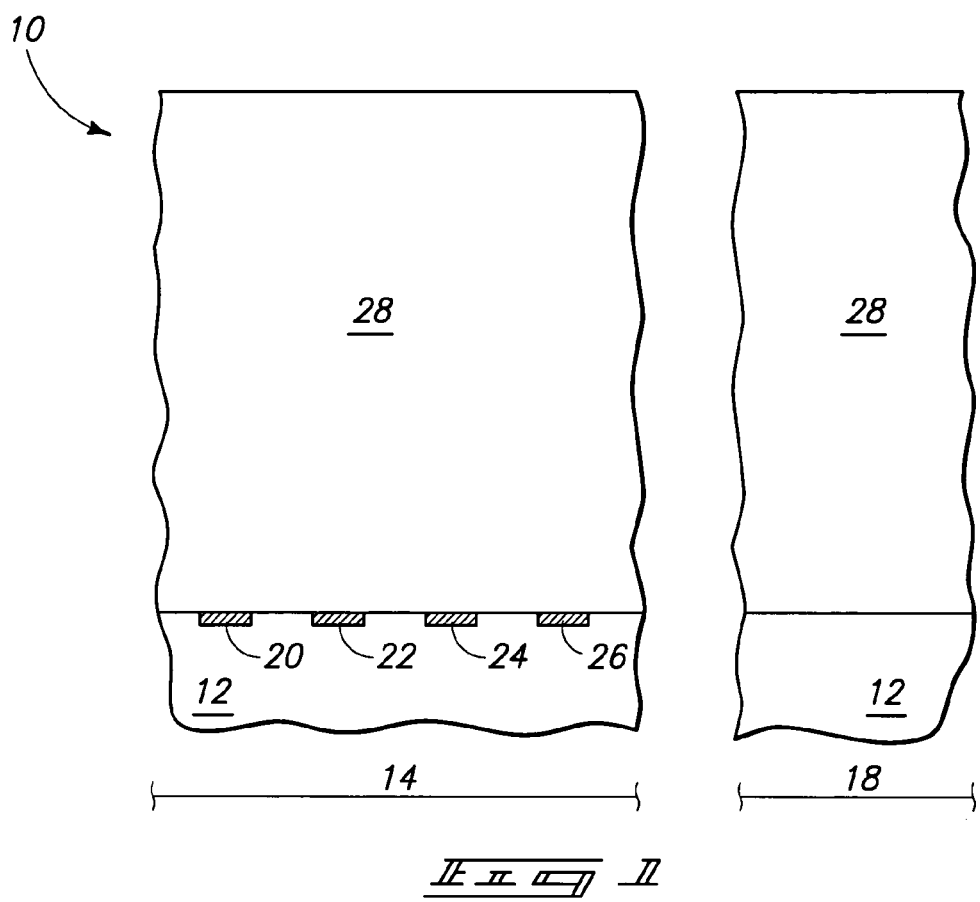
FIG. 1 is a diagrammatic, fragmentary sectional view taken through line 1—1 in FIG. 2.
Figure 2:
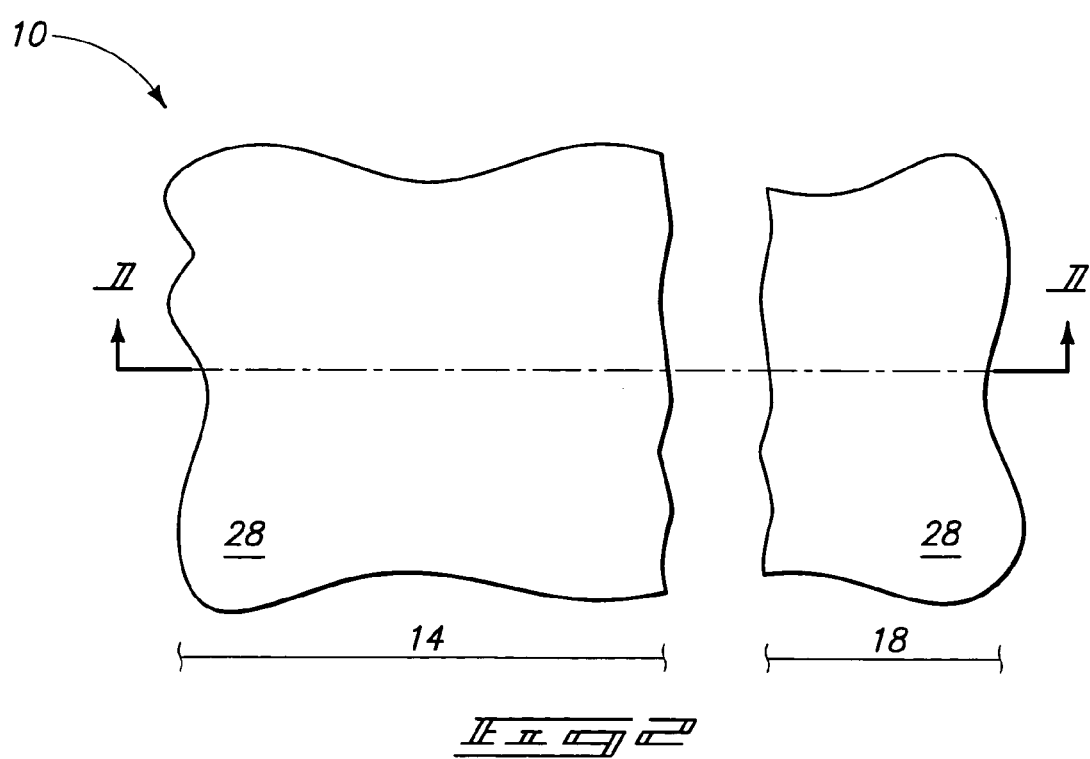
FIG. 2 is a diagrammatic, fragmentary, top plan view of a semiconductor substrate in process in accordance with an aspect of the invention.

Referring to FIG. 1, a semiconductor substrate in process in accordance with an aspect of the invention is indicated generally with reference to numeral 10. Such comprises a substrate 12 which in one exemplary embodiment comprises a semiconductor substrate, for example comprised of bulk monocrystalline silicon or other material. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The discussion proceeds in a preferred embodiment method of forming an array of capacitors, for example as might be utilized in DRAM or other memory circuitry construction. Substrate fragment 10 can be considered as comprising a region 14 and a region 18. In conjunction with the problem identified in the "Background" section above which motivated the invention, region 18 might be located more proximate an edge of the substrate/wafer than is region 14. Of course, such regions might be located elsewhere over the substrate, and regardless reference or inclusion of multiple regions is not a requirement of aspects of the invention.

A plurality of electrically conductive node locations 20, 22, 24 and 26 is shown within region 14 of substrate 12. Node locations 20, 22, 24 and 26 can correspond to, for example, conductively-doped diffusion regions within a semiconductive material of substrate 12, and/or to conductive pedestals associated with substrate 12. Node locations 20, 22, 24 and 26 might be electrically conductive at this processing stage of FIG. 1, although electrical conductivity might be provided at a processing stage subsequent to that shown by FIG. 1. By way of example only, node locations 20, 22, 24 and 26 might ultimately be electrically connected with transistor constructions (not shown) and can correspond to source/drain regions of the transistor constructions, or can be ohmically connected to source/drain regions of transistor constructions. Transistor gates and other components of the transistor constructions can be present within region 14 at the processing point depicted by FIG. 1, or can be formed in subsequent processing. Of course processing independent of memory array fabrication is also contemplated.

A capacitor electrode-forming material 28 has been deposited over substrate 12. In the context of this document, a "capacitor electrode-forming material" is that material within which capacitor electrode openings are formed to a depth which encompasses such material, and as will be apparent from the continuing discussion. In one exemplary preferred embodiment, capacitor electrode-forming material 28 comprises silicon dioxide, more preferably silicon dioxide which is doped with at least one of boron and phosphorus, with borophosphosilicate glass (BPSG) being one specific example. Further and regardless, in exemplary preferred implementations, capacitor electrode-forming material 28 is homogeneous. However in other implementations, capacitor electrode-forming material 28 can have the attributes of mass 28 from the incorporated U.S. Patent Application Publication No. 2005/0054159 A1. An exemplary preferred thickness range for mass 28 is from 5,000 Angstroms to 50,000 Angstroms, with 20,000 Angstroms being a specific preferred example.

Figure 3:
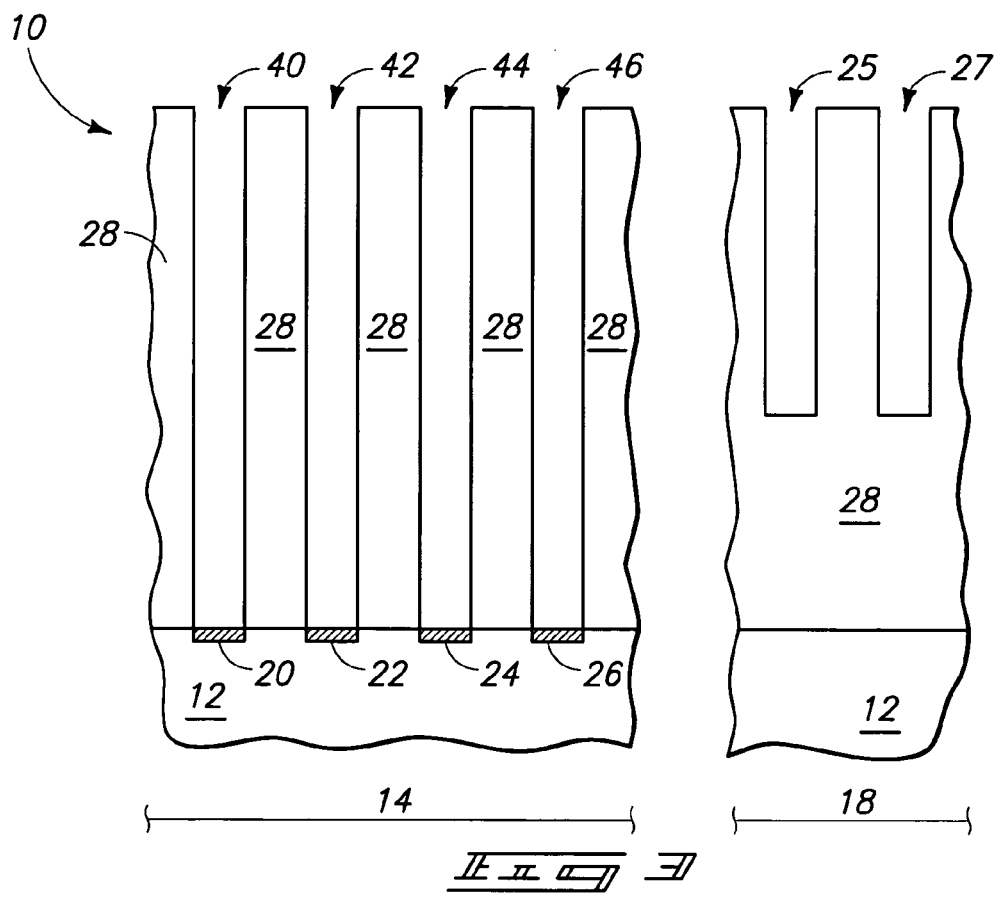
FIG. 3 is a view of the FIG. 1 substrate fragment at a processing step subsequent to that depicted by FIG. 1.
Figure 4:
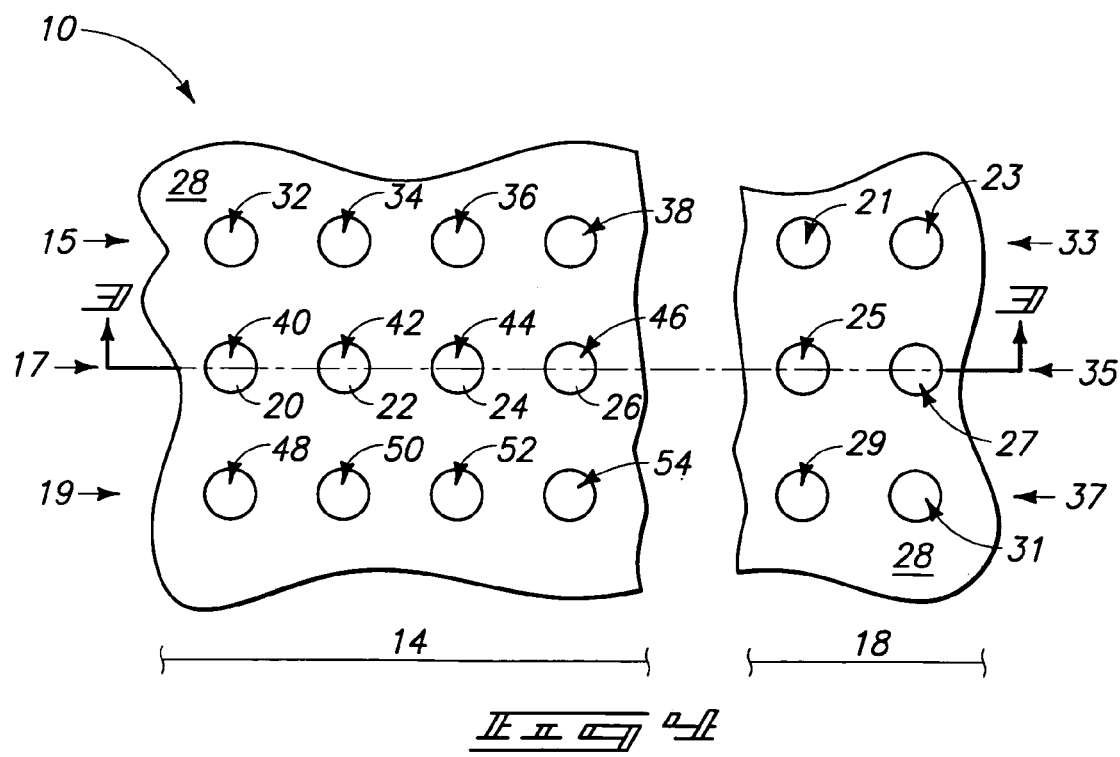
FIG. 4 is a view of the FIG. 2 substrate fragment at a processing step subsequent to that depicted by FIG. 2.

Referring to FIGS. 3 and 4, a plurality of capacitor electrode openings have been formed within the capacitor electrode-forming material. By way of example only, and in one implementation, a series of capacitor electrode openings 32, 34, 36, 38, 40, 42, 44, 46, 48, 50, 52, and 54 comprise a first set of such capacitor electrode openings formed in capacitor electrode-forming material 28, and exemplary capacitor electrode openings 21, 23, 25, 27, 29 and 31 comprise a second set of the plurality of capacitor electrode openings. Further in accordance with the definition of "capacitor electrode-forming material" provided above, such is that depth portion of material 28 which encompasses the openings, for example the complete depicted depth in region 14 where openings even-numbered 40–46 extend to their respective node locations even-numbered 20–26 and only the depth of material 28 to the bases of openings 25 and 27 in region 18. In this exemplary implementation, and in addressing in one aspect the problem which motivated the invention, the first set of capacitor electrode openings even-numbered 32–54 is formed to a depth within capacitor electrode-forming material 28 which is deeper or greater than that to which second set capacitor electrode openings odd-numbered 21–31 is formed. In the depicted exemplary embodiment, the first set of the plurality of capacitor electrode openings even-numbered 32–54 is formed in a series of lines 15, 17 and 19, and second set of plurality of capacitor electrode openings odd-numbered 21–31 is formed in a series of lines 33, 35 and 37. An exemplary preferred technique for forming the illustrated capacitor electrode openings comprises photolithographic patterning and etch. Openings even-numbered 40–46 by way of example only are shown formed to one common depth within material 28, and openings 25 and 27 are shown formed to a different common depth. Of course however, such openings need not be formed to respective common depths.

Referring to FIGS. 5 and 6, conductive first capacitor electrode material 56 has been formed within the plurality of capacitor electrode openings, including in this particular example the first and second sets of such openings. In one exemplary implementation and for purposes of the continuing discussion, first capacitor electrode material 56 can be considered as comprising respective bases 57 within the first set of the plurality of capacitor electrode openings even-numbered 32–54 and respective bases 58 within the second set of the plurality of capacitor electrode openings odd-numbered 21–31. The depths within the respective sets in the illustrated embodiment are shown to be the same within material 28, with such not in any way being a requirement. Any electrically conductive material (including more than one material) is suitable for first capacitor electrode material 56, including for example conductively doped semiconductive material, elemental metals, alloys of metals and/or metal compounds. One exemplary preferred material comprises titanium nitride. First capacitor electrode material 56 is shown as being formed within the respective openings in the shape of container-like structures, although pillars and any other structure whether existing or yet-to-be developed are also contemplated. The depicted container constructions can be considered as comprising inner surfaces 70 within the openings formed thereby, and outer lateral side surfaces 72 opposed to those of the inner surfaces.

Referring to FIG. 7–10, a sacrificial retaining structure 60 has been formed elevationally over both first capacitor electrode material 56 and capacitor electrode-forming material 28. An exemplary preferred thickness range is from 100 Angstroms to 1,000 Angstroms. In one exemplary preferred implementation, retaining structure 60 comprises a series of lines, for example the depicted lines 62 and 63 in region 14, and lines 64 and 65 in region 18. In one implementation, individual of the retaining structure lines run along at least a portion of and overlie two adjacent of the lines of capacitor electrode openings. For example, line 63 is illustrated as overlying lines 17 and 19 of capacitor electrode openings even-numbered 40–46 and 48–54, respectively, and line 64 is shown overlying the exemplary depicted two adjacent lines 33 and 35 of capacitor openings 21, 23 and 25, 27 respectively. Regardless, retaining structure 60 leaves some of capacitor electrode-forming material 28 exposed.

In one exemplary implementation, and as depicted, sacrificial retaining structure 60 is received on homogeneous capacitor electrode-forming material 28. In the context of this document, "on" means in at least some direct physical contact therewith. In one exemplary implementation, retaining structure 60 is homogeneous. Regardless, in one exemplary implementation, retaining structure 60 is insulative. By way of example only, preferred insulative materials include photoresist, amorphous carbon, and silicon nitride. In one exemplary implementation, the retaining structure is conductive, with conductively doped polysilicon comprising one example. Other conductive materials, for example metal and/or metal compounds are also contemplated. Further, the invention contemplates the retaining structure as comprising polysilicon regardless of whether conductively doped, including polysilicon which is void of any effective conductivity enhancing doping.

Figure 11:
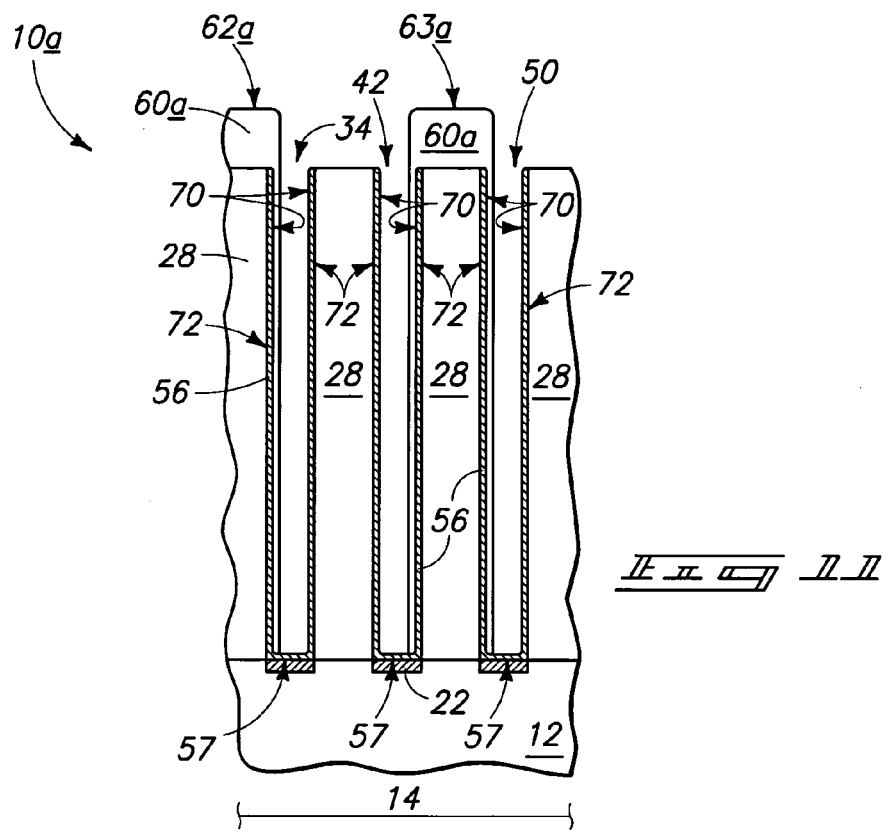
FIG. 11 is an alternate embodiment to that depicted by FIG. 9.

In one implementation and as depicted, a portion of retaining structure 60 is received within at least some of the capacitor electrode openings within which the first capacitor electrode material is formed. The exemplary preferred profile is with respect to a preferred embodiment photoresist material, whereby some tapering would typically occur as shown at the top of the respective electrodes in FIGS. 9 and 10 when container capacitor electrode constructions are utilized. FIGS. 7, 9 and 10 also depict some of the retaining structure material 60 as having deposited at the base of the respective electrodes, which is depicted in the form of masses 66 (the same material as that of retaining stucture 60). Alternately, and by way of example only, retaining structures 60 might be conformal extending entirely along the respective illustrated sidewalls of a given container electrode. For example, FIG. 11 by way of example only depicts an alternate exemplary embodiment substrate fragment 10*a* corresponding to the FIG. 9 view. Like numerals from the first described embodiment are utilized where appropriate, with differences being indicated with the suffix "a" or with different numerals. FIG. 11 depicts retaining structures 60*a* extending conformally along inner sidewalls 70 within the respective container openings of the respective electrodes.

Figure 12:
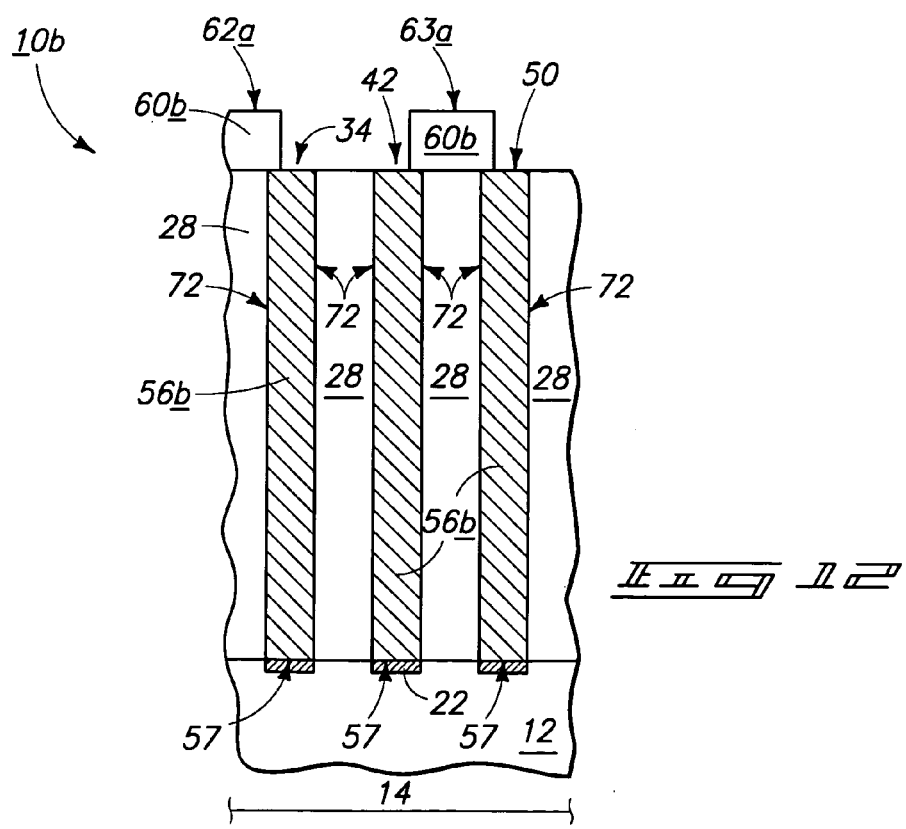
FIG. 12 is another alternate embodiment to that depicted by FIG. 9.

The invention also contemplates no portion of the retaining structure being received within the capacitor electrode openings. A first exemplary such embodiment is shown in FIG. 12 with respect to a substrate fragment 10*b*, with FIG. 12 corresponding positionally to the FIG. 9 section. Like numerals from the first described embodiment have been utilized where appropriate, with differences being indicated with the suffix "b" or with different numerals. FIG. 12 depicts an exemplary embodiment wherein first capacitor electrode material 56*b* has been deposited to completely fill the respective capacitor electrode openings. Accordingly, no portion of retaining structure 60*b* is received within any of the capacitor electrode openings.

Alternate exemplary processing with respect to exemplary container structures is described with reference to FIG. 13 in connection with a wafer fragment 10*c*, with FIG. 13 corresponding positionally to the FIG. 9 section. Like numerals from the first described embodiment have been utilized where appropriate, with differences being indicated with the suffix "c". FIG. 13 depicts the respective container openings formed by material 56 having been filled with a material 68, with exemplary such materials being photoresist, amorphous carbon, spin on dielectric, polysilicon, or any other material that can be removed later selectively relative to the first electrode material. Thereby, no portion of retaining structures 60*c* is received within the capacitor electrode openings.

The depicted FIGS. 9–11 embodiments depict sacrificial retaining structure 60 as comprising other than a substantially planar base received elevationally over first capacitor electrode material 56 and elevationally over capacitor electrode-forming material 28. Rather, the depicted respective base (meaning that portion which is against materials 28 and 56) of each of retaining structures 60/60*a* in such figures conforms at least in part to the upper surface of the capacitor electrode-forming material 28 and also along at least some of sidewall surfaces 70 of first capacitor electrode material 56. The exemplary depicted FIGS. 12 and 13 embodiments, by way of example only, do depict sacrificial retaining structures as having a substantially planar base which is received elevationally over both first capacitor electrode material 56*b*, 56 and capacitor electrode-forming material 28, respectively. In one exemplary preferred embodiment, the sacrificial retaining structure has a substantially planar base which is received on both silicon dioxide of the capacitor electrode-forming material and on the first capacitor electrode material, for example as depicted in FIGS. 12 and 13. In one exemplary embodiment, the sacrificial retaining structure comprises at least one of polysilicon, amorphous carbon and silicon nitride, and has a substantially planar base received elevationally over both the first capacitor electrode material and the capacitor electrode-forming material.

The preferred embodiment depicted retaining structures in the form of lines would likely extend to be received over, connect with, and/or comprises a part of a mass of material 60 received over circuitry area peripheral (not shown) to that of areas where the preferred embodiment array of capacitors is being formed, for example as shown in the U.S. Patent Application Publication No. 2005/0054159 A1 incorporated by reference above.

Figure 15:
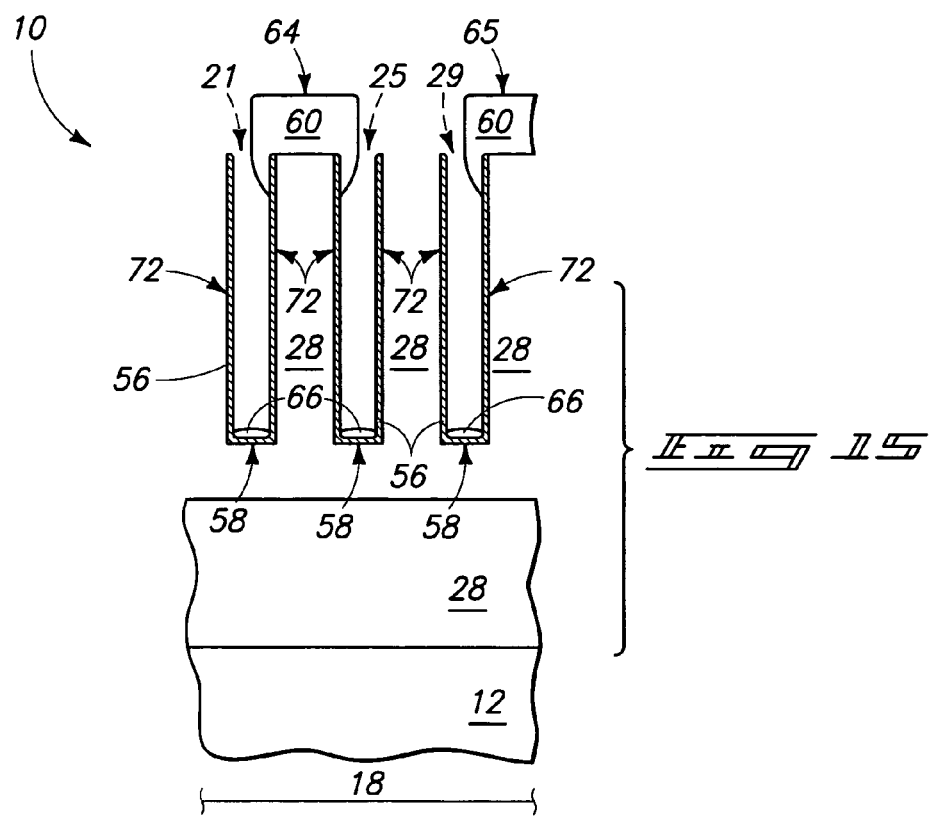
FIG. 15 is a view of the FIG. 10 substrate fragment at a processing step subsequent to that depicted by FIG. 10, and corresponding in sequence to that of FIG. 14.

Referring to FIGS. 14 and 15, and with sacrificial retaining structure 60 over the substrate, at least some of capacitor electrode-forming material 28 is etched from the substrate effective to expose outer sidewall surfaces 72 of first capacitor electrode material 56. Of course, all or only some of such surfaces might be exposed, with only partial exposure being shown in FIG. 14. An exemplary preferred etching is wet etching. Where in conjunction with the problem that motivated the invention there exists a second set of capacitor electrode openings which are not as deep as the desired first set, for example as shown in FIG. 3, the exemplary etching of material 28 might be to a depth therein which is below the base of the first capacitor electrode material formed in at least one of the capacitor electrode openings of the second set, for example as depicted in FIG. 15. There illustrated, by way of example only, the etching of material 28 has been to an elevation well below the bases 58 of conductive first capacitor electrode material 56, and whereby retaining structure 60 has precluded material 56 from lifting off and being deposited elsewhere over the substrate.

Figure 16:
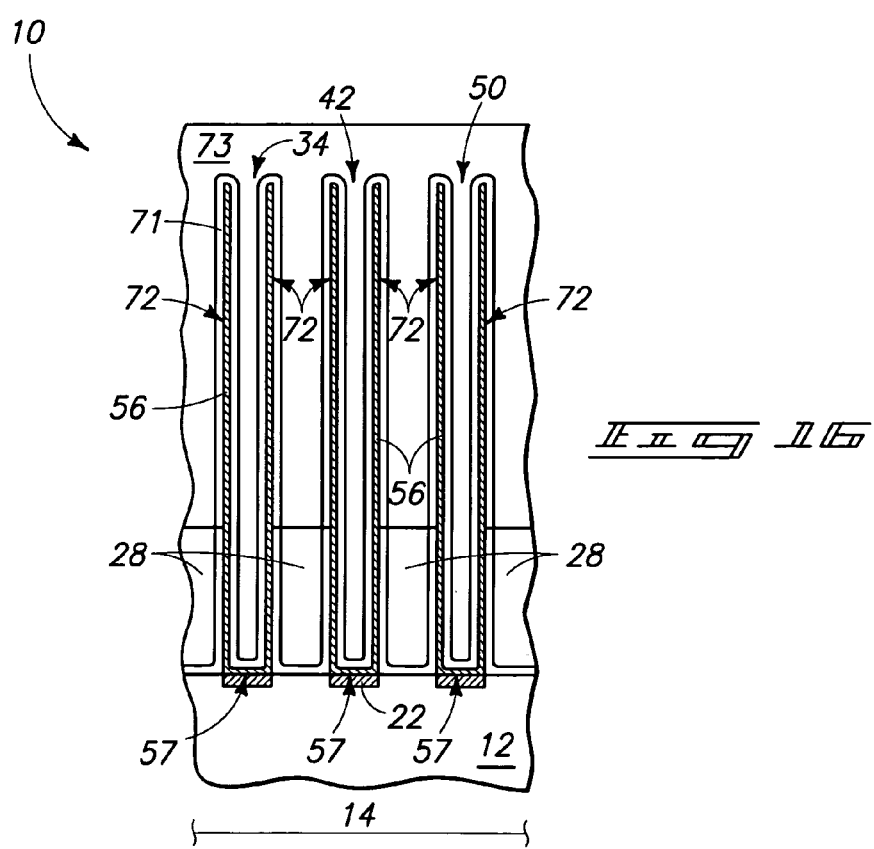
FIG. 16 is a view of the FIG. 14 substrate fragment at a processing step subsequent to that depicted by FIG. 14.

Referring to FIG. 16 and after the etching, sacrificial retaining structure 60 (not shown) has been removed from the substrate, and then a capacitor dielectric material 71 and conductive second capacitor electrode material 73 have been formed over outer sidewall surfaces 72 of first capacitor electrode material 56 formed within the respective capacitor electrode openings, and as shown also formed within the container openings in the exemplary preferred embodiment. Any suitable materials 71 and 73 are contemplated, and whether existing or yet-to-be-developed. Second capacitor electrode material 73 might be the same or different in composition from that of first capacitor electrode material 56. Removal of retaining structure 60 is preferably conducted in a dry etching manner, for example with respect to photoresist by a dry O$_2$ etch. Preferred dry etching is more likely to cause the discrete capacitor electrode material of FIG. 15 to fall and adhere to immediately underlying material 28, as well as to each other, as opposed to being deposited elsewhere on the substrate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of capacitors, comprising:
   forming a plurality of capacitor electrode openings within capacitor electrode-forming material received over a substrate, a first set of the plurality of capacitor electrode openings being formed to a depth which is greater within the capacitor electrode-forming material than is a second set of the plurality of capacitor electrode openings;
   forming conductive first capacitor electrode material within the first and second sets of the plurality of capacitor electrode openings, the first capacitor electrode material comprising respective bases within the first and second sets of the plurality of capacitor electrode openings;
   forming a sacrificial retaining structure elevationally over both the first capacitor electrode material and the capacitor electrode-forming material, the retaining structure leaving some of the capacitor electrode-forming material exposed;
   with the sacrificial retaining structure over the substrate, etching at least some of the capacitor electrode-forming material from the substrate effective to expose outer sidewall surfaces of the first capacitor electrode material; and
   after the etching, removing the sacrificial retaining structure from the substrate and then forming capacitor dielectric material and conductive second capacitor electrode material over the outer sidewall surfaces of the first capacitor electrode material formed within the first and second sets of capacitor openings.

2. The method of claim 1 wherein the capacitor electrode-forming material is homogeneous.

3. The method of claim 1 wherein the retaining structure is homogeneous.

4. The method of claim 1 wherein the retaining structure is insulative.

5. The method of claim 4 wherein the retaining structure comprises photoresist.

6. The method of claim 4 wherein the retaining structure comprises amorphous carbon.

7. The method of claim 4 wherein the retaining structure comprises silicon nitride.

8. The method of claim 1 wherein the retaining structure is conductive.

9. The method of claim 8 wherein the retaining structure comprises conductively doped polysilicon.

10. The method of claim 1 wherein the retaining structure comprises polysilicon.

11. The method of claim 10 wherein the polysilicon is void of conductivity enhancing doping.

12. The method of claim 1 wherein a portion of the retaining structure is received within at least some of the capacitor electrode openings.

13. The method of claim 1 wherein no portion of the retaining structure is received within the capacitor electrode openings.

14. The method of claim 1 wherein the first and second sets of the plurality of capacitor electrode openings are formed in lines, the retaining structure comprises a series of lines, individual of the retaining structure lines running along at least a portion of and overlying two adjacent of the lines of the capacitor electrode openings.

15. The method of claim 14 wherein no portion of the retaining structure is received within the capacitor electrode openings.

16. The method of claim 1 wherein the retaining structure comprises a substantially planar base received elevationally over both the first capacitor electrode material and the capacitor electrode-forming material.

17. The method of claim 1 wherein first capacitor electrode material is formed into respective container shapes within individual of the plurality of capacitor electrode openings.

18. The method of claim 1 wherein the etching comprises wet etching.

19. The method of claim 1 wherein the etching of the capacitor electrode-forming material is to a depth therein which is below the base of the first capacitor electrode, material formed in at least one of the capacitor electrode openings of the second set.

20. The method of claim 19 wherein the retaining structure is insulative.

21. The method of claim 20 wherein the retaining structure comprises photoresist.

22. The method of claim 20 wherein the retaining structure comprises amorphous carbon.

23. The method of claim 20 wherein the retaining structure comprises silicon nitride.

24. The method of claim 19 wherein the retaining structure is conductive.

25. The method of claim 24 wherein the retaining structure comprises conductively doped polysilicon.

26. The method of claim 19 wherein the retaining structure comprises polysilicon.

27. The method of claim 26 wherein the polysilicon is void of conductivity enhancing doping.

28. The method of claim 1 wherein the removing is by etching, the etching of said removing comprising dry etching.

* * * * *

UNITED STATES PATENT AND TRADEMARK OFFICE
CERTIFICATE OF CORRECTION

PATENT NO. : 7,202,127 B2
APPLICATION NO. : 10/928931
DATED : April 10, 2007
INVENTOR(S) : Busch et al.

Page 1 of 1

It is certified that error appears in the above-identified patent and that said Letters Patent is hereby corrected as shown below:

Col. 3, line 7 -
  Replace "FIG. 9 sectional view taken through line 9–9 in FIG. 8."
  With --FIG. 9 is a sectional view taken through line 9–9 in FIG. 8.--

Col. 3, lines 8-9 -
  Replace "FIG. 10 sectional view taken through line 10–10 in FIG. 8."
  With --FIG. 10 is a sectional view taken through line10–10 in FIG. 8.--

Col. 5, line 34 -
  Replace "Referring to FIG. 7–10, a sacrificial retaining structure 60"
  With --Referring to FIGS. 7–10, a sacrificial retaining structure 60--

Signed and Sealed this

Eighteenth Day of December, 2007

JON W. DUDAS
*Director of the United States Patent and Trademark Office*